US007229704B2

(12) United States Patent
Seki et al.

(10) Patent No.: US 7,229,704 B2
(45) Date of Patent: Jun. 12, 2007

(54) ORGANIC ELECTROLUMINESCENT DEVICE AND METHOD OF MANUFACTURING THE SAME, AND ELECTRONIC APPARATUS

(75) Inventors: Shunichi Seki, Suwa (JP); Ryuji Ishii, Chino (JP)

(73) Assignee: Seiko Epson Corporation, Tokyo (JP)

( * ) Notice: Subject to any disclaimer, the term of this patent is extended or adjusted under 35 U.S.C. 154(b) by 293 days.

(21) Appl. No.: 10/860,069

(22) Filed: Jun. 4, 2004

(65) Prior Publication Data

US 2005/0014021 A1 Jan. 20, 2005

(30) Foreign Application Priority Data

Jun. 26, 2003 (JP) ............................. 2003-182962
Mar. 17, 2004 (JP) ............................. 2004-076584

(51) Int. Cl.
*H01L 51/50* (2006.01)
*H01L 51/56* (2006.01)
*H05B 33/12* (2006.01)

(52) U.S. Cl. ...................... 428/690; 428/917; 313/504; 313/506; 427/66

(58) Field of Classification Search ................ 428/690, 428/917; 313/504, 506; 427/66
See application file for complete search history.

(56) References Cited

U.S. PATENT DOCUMENTS 6,150,042 A * 11/2000 Tamano et al. ............. 428/690
6,356,032 B1 * 3/2002 Suzuki et al. ............ 315/169.3
6,605,317 B1 * 8/2003 Kathirgamanathan ....... 427/162
6,656,611 B2 * 12/2003 Tai et al. .................... 428/690
7,049,010 B1 * 5/2006 Holmes et al. ............. 428/690
2003/0181694 A1 9/2003 Shirane et al.

FOREIGN PATENT DOCUMENTS

| | | | |
|---|---|---|---|
| JP | 10-134961 | | 5/1998 |
| JP | 11-121177 | | 4/1999 |
| JP | 2001-052864 | | 2/2001 |
| JP | 2002184583 | * | 6/2002 |
| JP | 2003-3165 | | 1/2003 |
| JP | 2003-243175 | | 8/2003 |
| JP | 2003-249367 | | 9/2003 |

* cited by examiner

*Primary Examiner*—Dawn L. Garrett
(74) *Attorney, Agent, or Firm*—Oliff & Berridge, PLC

(57) ABSTRACT

To provide an organic EL device and a method of manufacturing the same, having light-emitting characteristics enhanced by capturing selectively mobile metal ions, the organic EL device includes between a first electrode and a second electrode, a functional layer having at least a light-emitting layer. A metal ion trapping layer is placed between the first electrode and the second electrode. The metal ion trapping layer is formed of a metal ion trapping material with a ring part including a plurality of Lewis basic elements bonded to at least two carbon atoms.

7 Claims, 4 Drawing Sheets

ORGANIC ELECTROLUMINESCENT DEVICE AND METHOD OF MANUFACTURING THE SAME, AND ELECTRONIC APPARATUS

BACKGROUND OF THE INVENTION

1. Field of Invention

The present invention relates to an organic electroluminescent device and a method of manufacturing the same, and an electronic apparatus, having light-emitting characteristics enhanced by capturing selectively mobile metal ions.

2. Description of Related Art

In recent years, as an active light-emitting type display, an organic electroluminescent element (hereinafter "organic EL element"), in which an organic material is utilized in a light-emitting layer, has been developed. In manufacturing for an organic EL device with the organic EL elements, a functional material to form a functional layer, such as a light-emitting layer, a carrier injection/transport layer, that is, a hole injection/transport layer and an electron injection/transport layer becomes one of important factors to fix the characteristics and the like, of an organic EL device.

SUMMARY OF THE INVENTION

A related art organic EL device (an electro-optical device) have TFT elements as driving elements. However, in the organic EL device, if mobile ions including an alkali metal or an alkaline earth metal get into a material to form a functional layer, the ions diffuse to the side of TFT elements as impurities. As a result, characteristics of the TFT elements are considerably deteriorated and become a problem.

According to a related art solution to the problem, an insulating layer (a passivation layer) is formed between the side having TFT elements and the functional layer. Thus the diffusion of the mobile ions into the side of TFT elements is prevented (see, Japanese unexamined Patent Application Publication No. 2001-52864).

However, in an organic EL device (an electro-optical device) with the insulating layer, it can prevent the diffusion of mobile ions to the side of TFT elements, thereby preventing characteristics of TFT elements from being deteriorated. But it can not prevent the deterioration of the light-emitting characteristics caused by the diffusion of mobile ions into the light-emitting layer.

In case of having a hole injection/transport layer as a functional layer, if there are, for example, Na ions in the material to form the hole injection/transport layer, the Na ions become mobile ions to diffuse into the light-emitting layer. Thus the light-emitting characteristics of the light-emitting layer is deteriorated. However, since the insulating layer does not prevent the diffusion of Na ions into the light-emitting layer, it is not possible to prevent the light-emitting characteristics from being deteriorated.

Further, there is also another possibility for the metal ions from electrodes to become mobile ions resulting diffusion into the light-emitting layer. That is, since it is also impossible for the insulating layer to prevent the diffusion of the mobile ions, therefore, it is not possible to prevent the light-emitting characteristics from being deteriorated, too.

Considering the situation described above, the present invention provides an organic El device and method of manufacturing the same, having light-emitting characteristics enhanced by capturing selectively mobile metal ions.

To achieve the above, an aspect of the present invention provides an organic EL device including, between a first electrode and a second electrode, a functional layer having at least a light-emitting layer, a metal ion trapping layer being placed between the first electrode and the second electrode, and the metal ion trapping layer being formed of a metal ion trapping material with a ring part including a plurality of Lewis basic elements bonded to at least two carbon atoms.

With the organic EL device, since there is a metal ion trapping layer between the first electrode and the second electrode, when metal ions included in each electrode and a functional layer, such as a hole injection/transport layer, become mobile ions to diffuse, the mobile ions are captured by the metal ion trapping layer, thereby reducing or preventing the light-emitting characteristics from being deteriorated.

Further, since the metal ion trapping layer have a ring part, by selecting the size of the ring part in advance, it is possible to give selectivity to metal to be captured.

Further, according to the organic EL device as described above, the metal ion trapping material may have a structure including at least two carbon atoms interposed between the Lewis basic elements and containing a single bond between the carbon atoms.

With the structure as described above, by making the Lewis basicity of Lewis basic element strong, it is possible to enhance the metal ion trapping capability of the metal ion trapping material, thereby reducing or preventing the light-emitting characteristics from being deteriorated.

Further, according to the organic EL devices as described above, the Lewis basic elements may be oxygen or nitrogen.

With the structure as described above, an oxygen atom or a nitrogen atom carries negative charge. Thus it becomes easier to capture the metal ion carrying positive charge. Therefore, the trapping capability of the metal ion trapping layer to mobile ions (metal ions) is enhanced, by which it is secured to reduce or prevent the light-emitting characteristics from being deteriorated.

According to the organic EL device as described above, the metal ion trapping material may be crown ether.

With the above structure, since a selectivity of a metal ion to be captured is determined depending on the size of crown ether ring, it is possible to select the crown ether ring of a size corresponding to an impurity (metal ion) to be expected, thereby obtaining further enhanced capturing capability.

Further, according to the organic EL device as described above, the metal ion trapping material may be a polymer of a crown ether derivative.

Since crown ether itself has a relatively low molecular weight, even in case of capturing impurities (metal ions), the crown ether with the impurities moves into the metal ion trapping layer, and consequently may transfer captured impurities to the light-emitting layer. However, by making the metal ion trapping material a polymer of a crown ether derivative, it is difficult for the polymer to move into the metal ion trapping layer because the molecular weight of the polymer becomes high. Consequently, it is not easy for the captured impurities (metal ions) to be transferred into the light-emitting layer.

Further, according to the organic EL device as described above, the metal ion trapping material may be a copolymer of a crown ether derivative and a light-emitting layer forming material to form the light-emitting layer.

Even if the copolymer is used, since a molecular weight becomes high, it is not easy for the molecule to move in the metal ion trapping layer. Consequently, it becomes difficult to transfer the captured impurities (metal ions) into the light-emitting layer.

Further, since there is a unit having the same structure as that of a material to form the light-emitting layer in the metal ion trapping layer, in case that the metal ion trapping layer is placed in contact with the light-emitting layer, affinity between the metal ion trapping layer and the light-emitting layer is enhanced. As a result, by enhanced adhesion of these layers, carriers are injected easily.

Further, according to the organic EL device, the functional layer may have a hole injection/transport layer between the first electrode and the second electrode. The metal ion trapping layer may be placed between the hole injection/transport layer and the light-emitting layer.

With the above construction, since particularly the mobile ions (metal ions) being present in the material to form the hole injection/transport layer are captured in the metal ion trapping layer, it is possible to reduce or prevent the light-emitting characteristics from being deteriorated because of diffusion of the mobile ions into the light-emitting layer.

Further, according to the organic EL device described above, the metal ion trapping layer may be placed between the second electrode and the light-emitting layer.

With the above construction, since particularly the mobile ions (metal ions) from the second electrode are captured in the metal ion trapping layer, it is possible to reduce or prevent the light-emitting characteristics from being deteriorated because of diffusion of the mobile ions into the light-emitting layer.

Further, according to the organic EL device as described above, the functional layer may have an electron injection/transport layer between the second electrode and the light-emitting layer. The metal ion trapping layer may be placed between the electron injection/transport layer and the light-emitting layer.

With the above construction, since particularly the mobile ions (metal ions) being present in the material to form the electron injection/transport layer or the second electrode are captured in the metal ion trapping layer, it is possible to reduce or prevent the light-emitting characteristics from being deteriorated because of diffusion of the mobile ions into the light-emitting layer.

Another organic EL device of an aspect of the present invention includes, between a first electrode and a second electrode, a functional layer having a light-emitting layer and a carrier injection/transport layer, at least a part of the functional layer being formed of a functional material forming the functional layer, to which is added a metal ion trapping material. The metal ion trapping material has a ring part including a plurality of Lewis basic elements bonded to at least two carbon atoms.

According to the organic EL device, since at least a part of the functional layer is formed of a functional material forming the functional layer, to which is added a metal ion trapping material, when the metal ions from each electrode and other functional layers become mobile ions to diffuse into the light-emitting layer and the ions are captured by the metal ion trapping material, it is possible to reduce or prevent the light-emitting characteristics from being deteriorating caused by the diffusion of the mobile ions into the light-emitting layer. Further, even in case that metal ions come to be included in the functional layer which is added with a metal ion trapping material since the ions may be captured by the metal ion trapping material, it is possible to reduce or prevent the diffusion of these metal ions into the light-emitting layer.

Further, the metal ion trapping layer is formed of a ring part, by selecting the size of the ring part in advance, it is possible to give selectivity to metal to be captured.

According to the organic EL device as described above, the metal ion trapping material may have a structure including at least two carbon atoms interposed between the Lewis basic elements and containing a single bond between the carbon atoms.

With the above construction, by making the Lewis basicity of Lewis basic element strong, it is possible to enhance the metal ion trapping capability of the metal ion trapping material, which reduces or prevents the light-emitting characteristics from being deteriorated.

Further, according to the organic EL device as described above, the Lewis basic elements may be oxygen or nitrogen.

With the above construction, an oxygen atom or a nitrogen atom carries negative charge. Thus it becomes easier to capture the metal ion carrying positive charge, as described above. Therefore, the trapping capability of the metal ion trapping layer to mobile ions (metal ions) is enhanced, which reduces or prevents the light-emitting characteristics from being deteriorated.

Further, according to the organic EL device as described above, the metal ion trapping material may be crown ether.

With the above construction, since a selectivity of a metal ion to be captured is determined depending on the size of a crown ether ring, it is possible to select the crown ether ring of the size corresponding to an impurity (metal ion) to be expected, thereby obtaining further enhanced capturing capability, as described above.

Further, according to the organic EL device as described above, the metal ion trapping material may be a polymer of a crown ether derivative.

With the above construction, for example, when a polymer of a crown ether derivative captures mobile ions (metal ions), a part, excluding the crown ether, forming polymerization, may easily receive electrons to show the electron transport capability enhanced. Therefore, since particularly electrons from the cathode side are easily transferred into the light-emitting layer, the light-emitting capability of the light-emitting layer may be enhanced.

Further, according to the organic EL device as described above, a functional layer, to which is added the metal ion trapping material, may form a light-emitting layer.

With the above construction, even if mobile ions (metal ions) come to diffuse into the light-emitting layer, since the mobile ions (metal ions) are captured by the metal ion trapping material, it is possible to reduce or prevent the light-emitting characteristics from being deteriorated by the mobile ions.

Further, according to the organic EL device as described above, the functional layer, to which is added the metal ion trapping material, may form a hole injection/transport layer as a carrier injection/transport layer.

With the construction described above, since particularly the mobile ions (metal ions) being present in the material to form the hole injection/transport layer are captured by the metal ion trapping material, it is possible to reduce or prevent the light-emitting characteristics from being deteriorated by the mobile ions.

Further, according to the organic EL device as described above, the functional layer, to which is added the metal ion trapping material, may form an electron injection/transport layer as a carrier injection/transport layer.

With the construction described above, since particularly the mobile ions (metal ions) being present in the material to form the electron injection/transport layer are captured by the metal ion trapping material, it is possible to reduce or prevent the light-emitting characteristics from being deteriorated by the mobile ions.

Another organic EL device of an aspect of the present invention including, between a first electrode and a second electrode, a functional layer having at least a light-emitting layer is characterized in that the light-emitting layer is formed of a copolymer of a crown ether derivative and a polymer-based light-emitting material derivative.

With the above construction, even if mobile ions (metal ions) come to diffuse into the light-emitting layer, since the mobile ions (metal ions) are captured by a crown ether derivative, it is possible to reduce or prevent the light-emitting characteristics from being deteriorated by the mobile ions.

Further, by selecting the structure of a crown ether ring in advance, it is possible to give selectivity to a metal to be captured.

According to a method of manufacturing an organic EL device of an aspect of the present invention, a method of manufacturing an organic EL device including, between a first electrode and a second electrode, a functional layer having at least a light-emitting layer includes a metal ion trapping layer formed by placing a metal ion trapping material between the first electrode and the second electrode. The metal ion trapping material has a ring part including a plurality of Lewis basic elements bonded to at least two carbon atoms.

With the method of manufacturing an organic EL device, since there is a metal ion trapping layer between the first electrode and the second electrode, when metal ions included in each electrode and a functional layer, such as a hole injection/transport layer, become mobile ions to diffuse, the mobile ions are captured by the metal ion trapping layer, by which it is possible to reduce or prevent the light-emitting characteristics from being deteriorated.

Further, since a material with a ring part is used as the metal ion trapping material, by selecting the size of the ring part in advance, it is possible to give selectivity to a metal to be captured.

Further, according to the method of manufacturing an organic EL device, the metal ion trapping layer may be formed by placing the metal ion trapping material by a liquid droplet discharging method.

With the construction described above, the metal ion trapping material can be placed on predetermined positions with enhanced accuracy. Therefore, for instance, the metal ion trapping material can be placed with selectivity corresponding to the color of the light-emitting layer.

Another method of manufacturing an organic EL device of an aspect of the present invention includes, between electrodes, a functional layer having a light-emitting layer and a carrier injection/transport layer, at least a part of the functional layer being formed of a functional material forming the functional layer, to which is added the metal ion trapping material having a ring part including a plurality of Lewis basic elements bonded to at least two carbon atoms.

With the method of manufacturing an organic EL device as described above, since at least a part of the functional layer is formed of a functional material forming the functional layer, to which is added the metal ion trapping material, when the metal ions from each electrode and other functional layers become mobile ions to diffuse and the ions are captured by the metal ion trapping material, it is possible to reduce or prevent the light-emitting characteristics from being deteriorating by the diffusion of the mobile ions into the light-emitting layer. Further, even in case that metal ions come to be included in the functional layer which is added with a metal ion trapping material, since the ions may be captured by the metal ion trapping material, it is possible to reduce or prevent the diffusion of these metal ions into the light-emitting layer.

Further, since a material with a ring part is used for the metal ion trapping material, by selecting the size of the ring part in advance, it is possible to give selectivity to metal to be captured.

Further, according to the method of manufacturing an organic EL device as described above, the functional layer may be formed by placing the functional material, to which is added the metal ion trapping material, by a liquid droplet discharging method.

With the construction as described above, the metal ion trapping material can be placed on predetermined positions with enhanced accuracy. Therefore, for instance, the metal ion trapping material can be placed with selectivity corresponding to the color of the light-emitting layer.

As another method of manufacturing an organic EL device of an aspect of the present invention, a method of manufacturing an organic EL device including, between a first electrode and a second electrode, a functional layer having at least a light-emitting layer, the light-emitting layer being formed by placing a liquid material containing a copolymer of a crown ether derivative and a polymer-based light-emitting material derivative, by a liquid droplet discharging method.

With the method of manufacturing an organic EL device as described above, the light-emitting layer is formed of a copolymer of a crown ether derivative and a polymer-based light-emitting material derivative. Therefore even if the metal ions included in each electrode and other functional layers become mobile ions to diffuse into the light-emitting layer, it is possible to reduce or prevent the light-emitting characteristics from being deteriorating by the mobile ions, because the ions are captured by the crown ether derivative in the light-emitting layer.

Further, by selecting the ring structure of the crown ether in advance, it is possible to give selectivity to a metal to be captured.

Further, since a liquid material containing a copolymer is placed by the liquid droplet discharging method, the liquid material can be placed on predetermined positions with enhanced accuracy. Therefore, for instance, the liquid material can be placed with selectivity corresponding to the color of the light-emitting layer.

An electronic apparatus of an aspect of the present invention includes the above-mentioned organic EL devices.

According to the electronic apparatus including the organic EL device with enhanced light-emitting characteristics, it has higher reliability in display.

DETAILED DESCRIPTION OF EXEMPLARY EMBODIMENTS

Hereinafter, the present invention will be illustrated in detail.

First Exemplary Embodiment

Figure 1:
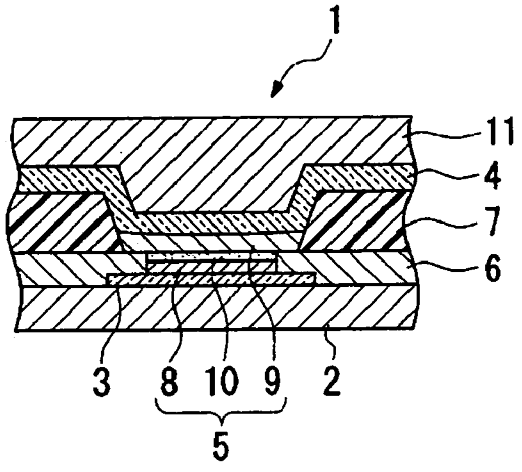
FIG. 1 is a schematic of a principal part of an organic EL device according to an aspect of the present invention.

FIG. 1 is a schematic of a principal part of a first exemplary embodiment of an organic EL device according to the present invention. Reference numeral 1 in FIG. 1 is the organic EL device. The organic EL device 1 has a transparent electrode 3 (a first electrode) functioning as an anode and a cathode 4 (a second electrode) on the substrate 2, and a functional layer 5 disposed between the transparent electrode 3 and the cathode 4. Thus, the light emitted from the functional layer 5 is released from the side of the substrate 2, which is called as a bottom emission type.

The substrate 2, on the transparent substrate (not shown) such as a glass substrate, is constructed by forming driving elements (not shown) composed of TFT elements and a variety of wiring lines, and an insulating layer and a flattening layer on these driving elements and a variety of wiring lines which are intervened therebetween.

The transparent electrode 3 is formed by patterning every single dot formed on the substrate 2, and further connected to the driving elements composed of TFT elements and the variety of wiring lines. In this exemplary embodiment, the transparent electrode 3 is formed of indium tin oxide (ITO).

In the periphery of the transparent electrode 3, the inorganic bank 6 and the organic bank 7 which partition the single dot region are formed. In a concave part surrounded with the inorganic bank 6 and the organic bank 7, the functional layer 5 is provided.

The functional layer 5, particularly in each dot region emitting light components of red color and green color, as illustrated in the FIG. 1, has a hole injection/transport layer 8 and a light-emitting layer 9. Between the hole injection/transport layer 8 and the light-emitting layer 9, a metal ion trapping layer 10 is provided. Further, in the dot region emitting light of blue color, an electron injection/transport layer (not shown) is provided on the light-emitting layer 9 in addition to the hole injection/transport layer 8 and the light-emitting layer 9.

As a forming material for the hole injection/transport layer 8, a dispersion solution of 3,4-polyethylenedioxythiophene/polystyrene sulfonic acid (PEDOT/PSS), i.e., a dispersion solution which is obtained by dispersing 3,4-polyethylenedioxythiophene in polystyrene sulfonic acid as a dispersant and further dispersing the resultant in water, may be used. Here, Na ions with a concentration close to 500 ppm is contained in this forming material, and the Na ions diffuse as mobile ions.

As for the material to form the light-emitting layer 9, a material capable of emitting fluorescence or phosphorescence is used. In the present exemplary embodiment, particularly, emission wavelength bands corresponding to the three primary colors of light are used to achieve full color display, as described above. Three light-emitting layers (dots) including a light-emitting layer which the emission wavelength band corresponds to red color, a light-emitting layer which the emission wavelength band corresponds to green color, and a light-emitting layer which the emission wavelength band corresponds to blue color, constitutes one pixel. The light-emitting layers emit light with gray scale, so that the organic EL device 1 as a whole is constructed to perform a full color display.

As for the specific material to form the light-emitting layer 9, specifically, polymer-based materials including (poly)fluorene (PF) derivative, (poly)paraphenylenevinylene (PPV) derivative, polyphenylene (PP) derivative, polyparaphenylene (PPP) derivative, polyvinylcarbazole (PVK) derivative, polythiophene derivative, and polysilane, such as polymethylphenylsilane (PMPS) derivative may be used.

Further, it may also use these polymer-based materials doped with polymer-based materials, such as perylene based pigments, coumarin-based pigments and rhodamine-based pigments, or low molecular materials, such as rubrene, perylene, 9,10-diphenylanthracene, tetraphenylbutadiene, Nile Red, coumarin 6 and quinacridon.

The metal ion trapping layer 10 provided between the hole injection/transport layer 8 and the light-emitting layer is formed of a metal ion trapping material which is optically and electrically inert. The metal ion trapping material is constructed to have a ring part including a plurality of Lewis basic elements bonded to at least two carbon atoms. Herein, the Lewis basic elements are elements having Lewis basicity, in which the Lewis basicity is defined by G. N. Lewis. That is, G. N. Lewis defined electron-pair donor, the so-called electron donor as base and electron-pair acceptor, the so-called electron acceptor as acid. The concept of the base and the acid can be applied to the reaction of any solvent systems. Therefore, in the present invention, a material to be an electron donor is defined as Lewis basic element.

Examples of an element having Lewis basicity as described above include oxygen (O), nitrogen (N), sulfur (S), phosphorus (P), and the like. Particularly, oxygen and nitrogen are preferable.

Further, the metal ion trapping material may have at least two carbon atoms interposed between the Lewis basic elements and contain a single bond between the carbon atoms.

As a material satisfying these conditions, crown ether may be an example. Particularly in the present exemplary embodiment, a 15-crown-5-ether represented by the following compound (1) may be used.

Compound (1)

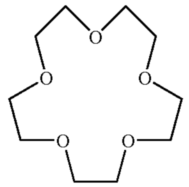

Crown ether itself, such as 15-crown-5-ether may be used as a metal ion trapping material, and may also used as a compound forming a ring part (a skeleton part) in the metal ion trapping material. Like the following compound (2), oxygen atoms forming crown ether may be substituted with a nitrogen atom to have a structure containing the nitrogen atom to which is added a side chain, such as an alkyl group.

Compound (2)

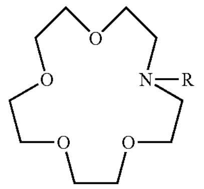

In a metal ion trapping material formed of the above-mentioned crown ether, particularly, since Lewis basic elements are oxygen or nitrogen, oxygen (nitrogen) atom carries negative charge. Thus it becomes easier to capture the metal ion (Na ion) carrying positive charge to form a complex.

Further, since crown ether has a structure including two carbon atoms interposed between the above-mentioned Lewis basic elements and containing a single bond between the carbon atoms, the basicity of the Lewis basic elements becomes strong, thereby enhancing a metal ion trapping capability.

Furthermore, since a selectivity of a metal ion to be captured determines depending on the size of crown ether ring, it is possible to select the crown ether ring of the size corresponding to an impurity (metal ion) to be expected, thereby obtaining further enhanced capturing capability to form a complex. In the present exemplary embodiment, particularly, in order to capture the Na ion in the hole injection/transport layer 8, the above-mentioned compound (1) (15-crown-5-ether) or the compound (2) are properly used.

Furthermore, in case of forming the metal ion trapping layer 10 by the metal ion trapping material including the crown ether as described above, the material is usually dissolved in a solvent to become liquid, and the liquid is placed on the hole injection/transport layer 8, is dried, and thus forms the metal ion trapping layer 10. However, particularly in case of using the material with the side chain as illustrated in the compound (2), by adjusting the size of the side chain (for example, in case of using an alkyl group ($—C_nH_{2n+1}$) as a side chain, the number of n), solubility thereof to a solvent can be adjusted. Further it is also possible to adjust lipophilicity and hydrophilicity thereof. Further, the side chain is not limited to the alkyl group, and a variety of groups including a benzene group may be added.

Furthermore, in order to adjust the solubility of the crown ether to a solvent, in addition to the method of adding a side chain to the nitrogen atom as a Lewis basic element illustrated in the compound (2), for example, it is also possible to add a side chain, such as an alkyl group to a carbon atom interposed between Lewis basic elements.

In addition, a metal ion trapping material, such as crown ether, for example, may capture a variety of metal ions, respectively, by mixing a variety of materials having different selectivity to metal ions to be captured.

Further, a metal ion trapping material is not limited to the above-mentioned crown ether. It is possible to use, for instance, dicyclohexano-18-crown-6, dibenzo-24-crown-8 or cyclam (1,4,8,11-tetrazacyclotetradecane), cyclodextrin, and further cryptand. The cryptand is also soluble to an organic solvent like crown ether and captures metal ions to form a complex.

The thickness of the metal ion trapping layer 10 formed of the metal ion trapping material is the thickness capable of securely capturing mobile ions (Na ions) in the material forming the hole injection/transport layer 8 as described above and does not obstruct moving of holes from the hole injection/transport layer 8 to the light-emitting layer 9. Specifically, the thickness is about 1 nm to 5 nm.

The cathode 4, which is formed to cover all of the pixel regions, is formed by laminating, in order from the side of the light-emitting layer 9, Ca layer and Al layer.

Further, a sealing layer 11 is formed on the cathode 4. The sealing layer 11 includes a protection layer, an adhesive layer, and a sealing substrate, which may be related art structure.

In order to manufacture the organic EL device with the construction as described above, TFT elements or various wiring lines may first be formed on a transparent substrate in the same way as in the related art. An interlayer insulating layer or a flattening layer is then formed, thereby obtaining the substrate 2.

Next, the transparent electrode 3 is formed by forming an ITO layer on the substrate 2 by a vapor deposition method, and patterning it.

Figure 2:
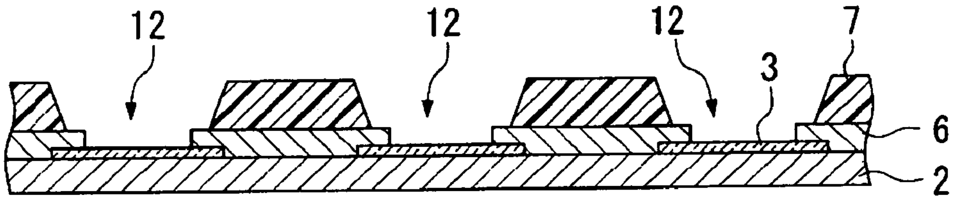
FIG. 2 is a schematic to explain a process to manufacture the organic EL device.

Subsequently, the inorganic bank 6 formed of $SiO_2$ is formed on the substrate 2 so as to surround the periphery of the transparent electrode 3, and the organic bank 7 formed of resin is also formed on the inorganic bank 6, so that a concave part 12 is formed on the transparent electrode 3, as shown in FIG. 2. Materials, such as polyimide or acrylic resin may be used for the organic bank 7. Materials obtained by containing fluorine in advance may be also used.

Figure 3A:
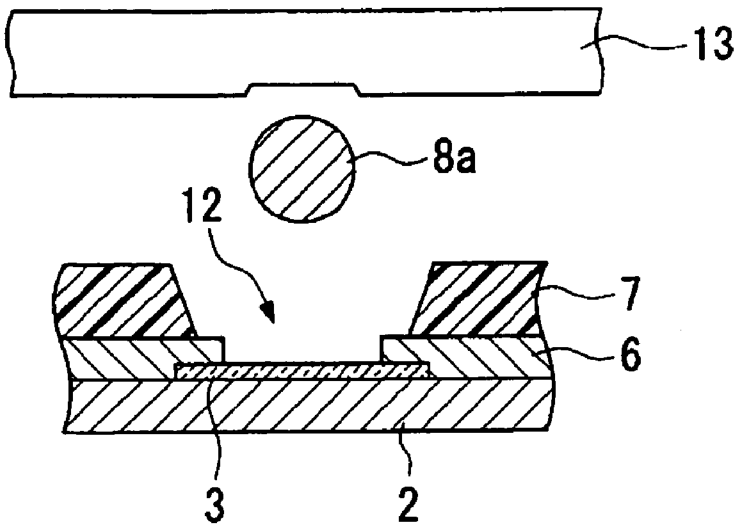
FIG. 3(A) and FIG. 3(B) are schematics for explaining a process followed by the process of FIG. 2.
Figure 3B:
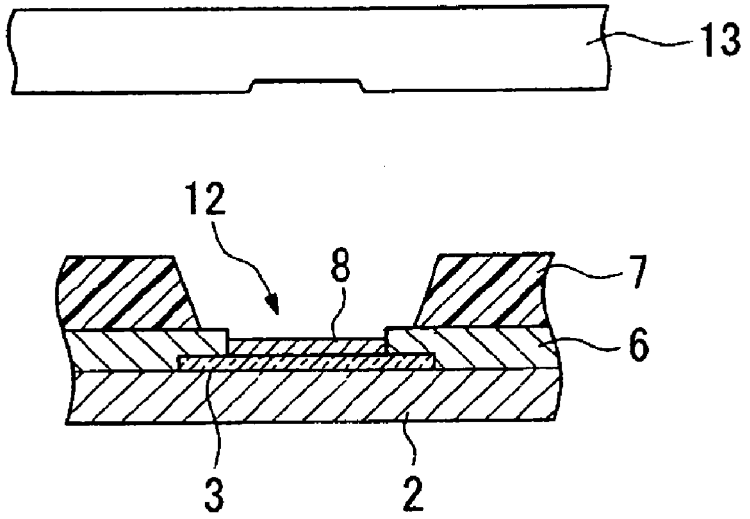

The wettability on the substrate shown in FIG. 2, in which the concave part 12 is surrounded by the inorganic bank 6 and the organic bank 7 is controlled by the consecutive treatment of oxygen plasma-$CF_4$ plasma. Subsequently the hole injection/transport layer 8 is formed inside the concave part 12 by a liquid droplet discharging method, such as an ink jet method. As shown in FIG. 3(A), a forming material 8*a* for the hole injection/transport layer 8 is discharged selectively within the concave part 12 from a liquid droplet discharging head (an ink jet head) 13. By drying and baking in succession, the hole injection/transport layer 8 is formed on the transparent electrode 3 as shown in FIG. 3(B).

Figure 4A:
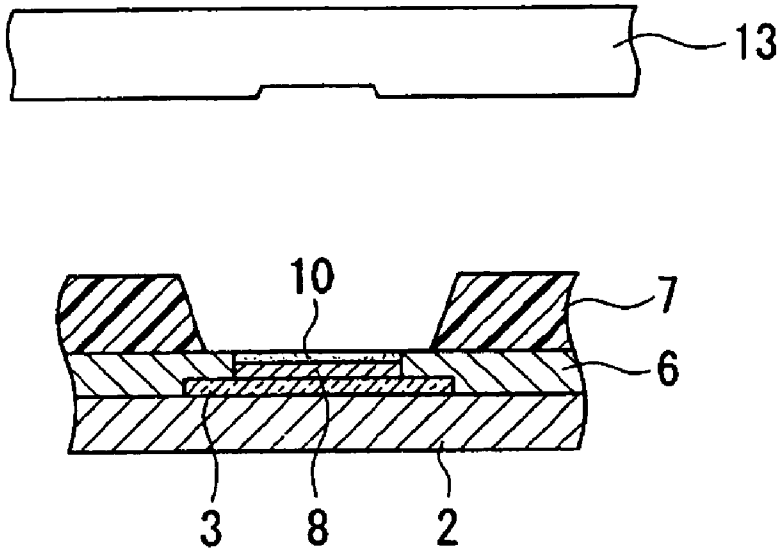
FIG. 4(A) and FIG. 4(B) are schematics for explaining a process followed by the process of FIG. 3.

Next, within the concave part 12, the metal ion trapping layer 10 is formed on the hole injection/transport layer 8. Also, in case of forming of the metal ion trapping layer 10, the liquid droplet discharging method (the ink jet method) may be used. The metal ion trapping material is discharged selectively on the hole injection/transport layer within the concave part 12 from the liquid droplet discharging head 13. Subsequently, by drying the material, the metal ion trapping layer 10 is formed on the hole injection/transport layer as shown in FIG. 4(A).

Here, in order to discharge a metal ion trapping material by a liquid droplet discharging method, the metal ion trapping material needs to be dissolved in a solvent to become a liquid with the desired viscosity. As a solvent to liquefy the material, for instance, a mixture solvent of cyclohexylbenzene (CHB) and ethanol (EtOH) is used. The metal ion trapping material (for instance, 15-crown-5-ether) is dissolved in the concentration of, for example, about 0.001 to 0.01 percent by weight, in the mixture solvent to become a liquid capable of discharging by the liquid droplet discharging method. By using the mixture solvent as described above, the hole injection/transport layer 8 with hydrophilicity does not need to re-dissolve. Therefore, the metal ion trapping layer 10 is formed properly with maintaining the hole injection/transport layer 8 properly. However, a hole injection/transport layer may be formed by adding the metal ion trapping material to a material to form hole injection/transport layer as described later. The hole injection/transport layer 8 may be re-dissolved in forming the metal ion trapping layer 10. However, in particular, it does not become a problem if the hole injection/transport capability of hole injection/transport layer 8 is not damaged. Further, instead of the mixture solvent, it is also possible to use warm toluene as a solvent.

Figure 4B:
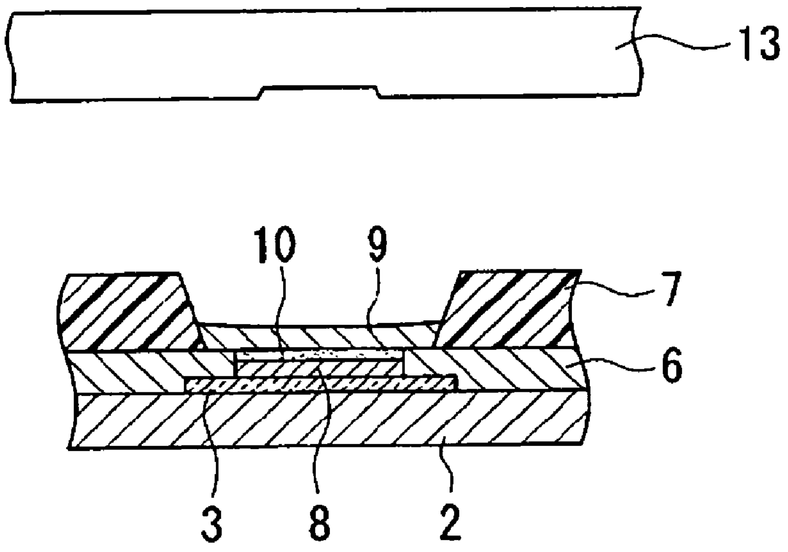

Next, as shown FIG. 4(B), the light-emitting layer 9 is formed on the metal ion trapping layer 10 in the concave part 12. The above-mentioned liquid droplet discharging method (the ink jet method) is properly applied to the formation of the light-emitting layer 9. That is, regarding the formation of the light-emitting layer 9, it is necessary to form the light-emitting layer of red color, the light-emitting layer of green color and the light-emitting layer of blue color, respectively. However, in case of using the liquid droplet discharging method, every layer can be easily formed by simply dividing forming materials of each light-emitting layer on the predetermined positions, respectively. Further, in forming the light-emitting layer 9, a solvent dissolving a material to form light-emitting layer preferably does not re-dissolve the metal ion trapping layer 10 to keep the metal ion trapping layer 10 intact. However, since it may form the light-emitting layer by adding a metal ion trapping material to the material to form the light-emitting layer as described later, the capturing performance of a metal ion trapping material to metal ions is not damaged even if the metal ion trapping layer 10 re-dissolves when the light-emitting layer 9 is formed.

Next, a Ca layer (calcium) may be formed by a vapor deposition method in the same way as in the related art by covering the light-emitting layer 9 and the organic bank 7. An Al (aluminum) layer is formed on the Ca layer, thereby forming a cathode 4 with the laminated structure of a Ca/Al. Particularly, in case of the blue light-emitting layer, an electron injection/transport layer may be formed using a mask with the selective vapor deposition of LiF on the blue light-emitting layer. But this will not be described in detail here.

Thereafter, a protective layer and an adhesive layer are formed on the cathode 4, and further by adhering a sealing substrate, the organic EL device 1 shown in FIG. 1 is obtained.

In the organic EL device 1, obtained as previously described, since the metal ion trapping layer 10 is placed between the hole injection/transport layer 8 and the light-emitting layer 9, particularly when Na ions in the hole injection/transport layer 8 become mobile ions to diffuse, it is possible for metal ions to be captured in the metal ion trapping layer 10. Therefore, it is possible to reduce or prevent the light-emitting characteristics from being deteriorated. For example, resulting shortened life, caused by diffusing of the Na ions into the light-emitting layer 9. Further, for instance, even when Sn ions in the transparent electrode 3 come to diffuse, they can be captured to reduce or prevent diffusing of the ions into the light-emitting layer 9. As a result, the deteriorating of the light-emitting characteristics can be reduced or prevented.

Second Exemplary Embodiment

Figure 5:
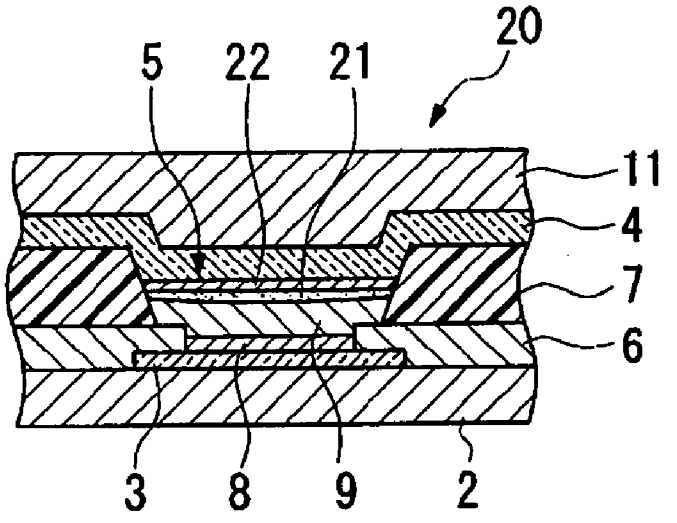
FIG. 5 is a sectional schematic of a principal part of a further organic EL device according to an aspect of the present invention.

FIG. 5 is a schematic of a principal part of a second exemplary embodiment of an organic EL device according to the present invention, and reference numeral 20 in FIG. 5 is the organic EL device. Furthermore, FIG. 5 is a schematic illustrating a part of a blue light-emitting layer, in particularly the organic EL device. The major difference between the organic EL device 1 shown in FIG. 1 and the organic EL device 20 is that the organic EL device 20 has the metal ion trapping layer 21 placed, not between the hole injection/transport layer 8 and the light-emitting layer 9, but between the light-emitting layer 9 and the electron injection/transport layer 22. Herein, in the present exemplary embodiment, the electron injection/transport layer 22 is formed on blue light-emitting layer, but not on the red light-emitting layer and green light-emitting layer. Therefore, a metal ion trapping layer 21 is also formed only on the blue light-emitting layer.

The organic EL device 20 shown in FIG. 5 has the transparent electrode 3 (the first electrode) and the cathode 4 (the second electrode) on the substrate 2, and the functional layer 5 between the transparent electrode 3 and the cathode 4. This is referred to as a bottom emission type, in which the metal ion trapping layer 21 is formed between the light-emitting layer 9 (the blue light-emitting layer) and the electron injection/transport layer 22 forming the functional layer 5.

The metal ion trapping layer 21 is formed of the material which is the same as that used to form the metal ion trapping layer 10 shown FIG. 1. Specifically, a metal ion trapping material to form metal ion trapping layer 21 has a ring part including a plurality of Lewis basic elements bonded to at least two carbon atoms. In more detail, it is soluble in organic solvent, such as the above-mentioned crown ether or cryptand. Further, the material is used to capture metal ions to form a complex.

However, in this exemplary embodiment, metal ions to be captured are not Na ions of the first exemplary embodiment but Li ions forming the electron injection/transport layer 22 as described later. To selectively capture the Li ions, 12-crown-4-ether represented by the following compound (3) is properly used.

Compound (3)

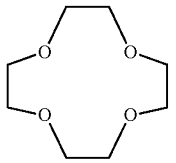

Since the compound (3) has a ring (a ring part) smaller than that of the compound (1), the compound (3) has a higher selectivity to the Li ion which is smaller than the Na ion. Therefore, the compound (3) can capture more Li ions to form a complex.

Further, as for a metal ion trapping material of the present exemplary embodiment, like the case of the compound (1), it may use a structure that oxygen atoms constituting crown ether of the compound (3) can be substituted with nitrogen atoms, and a side chain, such as an alkyl group, is added to nitrogen atoms. Further, it may mix a variety of materials having a different selectivity to metal ions to be captured.

The thickness of the metal ion trapping layer 21, formed of the metal ion trapping material, is a thickness to securely capture the mobile ions (Li ions) in the material forming the electron injection/transport layer 22 as described later and not to obstruct moving of hole from the electron injection/transport layer 22 to the light-emitting layer 9. Specifically, the thickness is about 1 nm to 5 nm.

The electron injection/transport layer 22 is provided in a case that blue light-emitting layer formed with a polymer-based material, in which the electron injection/transport layer 22 is formed by using a mask with the selective vapor deposition of LiF on the light-emitting layer (the blue light-emitting layer) 9. The electron injection/transport layer 22 formed of LiF is provided to efficiently inject and transport the electrons from the cathode 4 including Ca/AL on the electron injection/transport layer, to the light-emitting layer 9.

Further, Li ions in the electron injection/transport layer 22 become mobile ions to diffuse into the light-emitting layer 9 when the electron injection/transport layer 22 is in direct contact with the light-emitting layer 9 as before. While the Li ions stay on the surface of the light-emitting layer 9, specifically a boundary with the electron injection/transport layer 22, the Li ions function to pull ions from the cathode 4 to the side of the light-emitting layer 9, thereby increasing an electron injecting and transporting capability. However, after a certain amount of time, Li ions diffuse toward the center of the light-emitting layer 9, thereby decreasing a function to pull electrons. The light-emitting capability or the brightness of the light-emitting layer 9 is decreased. As a result, the life thereof is shortened.

In the present exemplary embodiment, as described above, the metal ion trapping layer 21 is placed between the light-emitting layer 9 and the electron injection/transport layer 22. By forming the metal ion trapping layer 21 as described above, Li ions forming the electron injection/transport layer 22 are captured in the metal ion trapping layer, thereby reducing or preventing the light-emitting characteristics from being deteriorated. For example, the life thereof from being shortened, which is caused by diffusing of Li ions into the light-emitting layer 9.

Further, in the present exemplary embodiment, the metal ion trapping layer 21 may be formed by the liquid droplet discharging method. By adopting the liquid droplet discharging method, a metal ion trapping material can be placed only on the blue light-emitting layer with selectivity and accuracy. Therefore, the reliability of the life of the blue light-emitting layer is obtained. Further, in case of adopting the liquid droplet discharging method, as a solvent to liquefy metal ion trapping material with a desired viscosity, for instance, the mixture solvent of cyclohexylbenzene (CHB) and ethanol (EtOH) as described above or the mixture solvent of CHB and isopropylbiphenyl (IPBP) may be used. A metal ion trapping material (for instance, 12-crown-4) dissolves in the concentration of, for instance, about 0.001 percent by weight, in these solvents to be used in the present exemplary embodiment.

Moreover, the present invention is not limited to the first and the second exemplary embodiments and can also be applied to a variety of modifications within the range of the present invention.

For instance, in the above exemplary embodiments, the metal ion trapping layer 10 (21) is placed between the hole injection/transport layer 8 and the light-emitting layer 9, or between the light-emitting layer 9 and the electron injection/transport layer 22. However, the metal ion trapping layers 10 and 21 may be placed in both cases, respectively.

Further, in the above exemplary embodiments, as a material to form the light-emitting layer 9, a polymer-based material is used. However, a low molecular weight material may also be used to form the light-emitting layer 9. In that case, an electron injection/transport layer can be placed not only on the blue light-emitting layer but also all over a light-emitting layer. Furthermore, a metal ion trapping layer may be placed to cover the whole surface between light-emitting layer and the electron injection/transport layer.

Third Exemplary Embodiment

Figure 6:
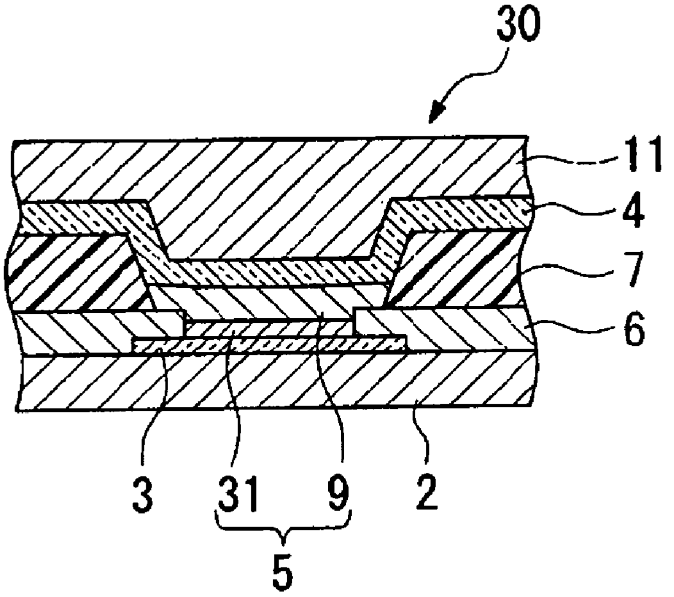
FIG. 6 is a sectional schematic of a principal part of a still further organic EL device according to an aspect of the present invention.

FIG. 6 is a schematic of a principal part of a third exemplary embodiment of an organic EL device according to the present invention, and reference numeral 30 in FIG. 6 is the organic EL device. The organic EL device 30 is different from the organic EL device 1 shown in FIG. 1 in that a metal ion trapping layer is not formed independently, and is formed by adding the metal ion trapping material to a part of a layer forming the functional layer 5, the hole injection/transport layer 31 as a carrier injection/transport layer in present exemplary embodiment.

The organic EL device 30 shown in FIG. 6 has the transparent electrode 3 (the first electrode) and the cathode 4 (the second electrode) on the substrate 2, and the functional layer 5 between the transparent electrode 3 and the cathode 4, which is called a bottom emission type. Particularly, the hole injection/transport layer 31 forming the functional layer 5 is formed of the material to form the hole injection/transport layer, to which is added a metal ion trapping material.

As a material to form the hole injection/transport layer, the above-mentioned 3,4-polyethylenedioxythiophene/polystyrene sulfonic acid (PEDOT/PSS) is used.

As a metal ion trapping material added to the material to form the hole injection/transport layer, as described above, the material having a ring part including a plurality of Lewis basic elements bonded to at least two carbon atoms is used. Particularly in the present exemplary embodiment, as the material is added to the material to form hole injection/transport layer, Na ions can be selectively captured Na ions. Thus the above-mentioned compound (1) or the compound (2) is properly used.

The addition ratio of a metal ion trapping material to a material to form a hole injection/transport layer is, for instance, about 0.01 to 0.1 percent by weight. If a metal ion trapping material is added under 0.01 percent by weight, the effect of adding the metal ion trapping material is not sufficient. Further, if the material is added over 0.1 percent by weight, the hole injection/transport capability of the hole injection/transport layer 31 may be decreased.

For placing a material to form a hole injection/transport layer formed by adding the metal ion trapping material on the transparent electrode 3 as described above, the above-mentioned liquid droplet discharging method may be used. By using the liquid droplet discharging method, it is possible to accurately place the material to form the hole injection/transport layer on the predetermined positions. Therefore, the reliability, such as the light-emitting capability, may be properly secured.

In the organic EL device 30 obtained as described above, since the metal ion trapping material is added to the hole injection/transport layer 31, by capturing Na ions in a material to form hole injection/transport layer with a metal ion trapping material and confining them within the hole injection/transport layer 31, it is possible to reduce or prevent diffusing of Na ions to the light-emitting layer 9 and deteriorating of the light-emitting characteristics, such as the life thereof.

Further, by capturing Na ions with a metal ion trapping material and confining them within the hole injection/transport layer 31, it is possible to reduce or prevent diffusing of Na ions to the side of TFT elements on the substrate 2 and deteriorating the characteristics of TFT elements.

Furthermore, for instance, even when Sn ions in the transparent electrode 3 diffuse, if a metal ion trapping material capable of capturing Sn ions is mixed in the hole injection/transport layer 31, moving ions in the hole injection/transport layer 31 can be captured by a metal ion trapping material. Thus diffusing of the ions into the light-emitting layer 9 and deteriorating of the light-emitting characteristics is reduced or prevented.

Further, in the third exemplary embodiment, the metal ion trapping material is added to the hole injection/transport layer 31 as a carrier injection/transport layer. Particularly, in case of forming the electron injection/transport layer with a polymeric material, it may form an electron injection/transport layer by adding the metal ion trapping material to the electron injection/transport material. With this construction, by capturing metal ions from the side of the cathode 4 or metal ions existing in the electron injection/transport material, with the metal ion trapping material and confining them within the electron injection/transport layer, it is possible to reduce or prevent the light-emitting characteristics from being deteriorated, for instance, the life thereof from being shortened, which is caused by diffusing of metal ions into the light-emitting layer 9.

Further, a light-emitting layer may be formed by adding the metal ion trapping material directly to a material to form light-emitting layer. With this construction, even when metal ions from the electron injection/transport layer or the hole injection/transport layer as a carrier injection/transport layer, and the transparent electrode 3 or the cathode 4 diffuse, a metal ion trapping material captures them to form a complex. Therefore, it is possible to reduce or prevent deteriorating of the light-emitting characteristics of the light-emitting layer caused by the metal ions.

Furthermore, the metal ion trapping layer 10 shown in FIG. 1 may be formed by using a material formed of the material to form light-emitting layer to which is added a metal ion trapping material. The metal ion trapping layer 21 shown in FIG. 5 may be also formed. Even with the construction, by the metal ion trapping material added to a material to form light-emitting layer, it is possible to reduce or prevent deteriorating of the light-emitting characteristics, such as a life of the light-emitting layer, caused by the diffusion of the metal ions into a light-emitting layer.

Fourth Exemplary Embodiment

Next, a fourth exemplary embodiment of an organic El device according to the present invention will be described in the following. The present exemplary embodiment is nearly similar to the organic EL device 20 shown in FIG. 5 in the basic construction. The difference between the present exemplary embodiment and the second exemplary embodiment shown in FIG. 5 is different in the metal ion trapping material to form the metal ion trapping layer 21.

That is, in the present exemplary embodiment, as a metal ion trapping material to form the metal ion trapping layer 21, a polymer of a crown ether derivative is used. Specifically, a polymer including a 12-crown-4-ether derivative, that is, a poly(crown ether)thiophene-2,5-diyl represented by the following compound 4, is properly used.

Compound (4)

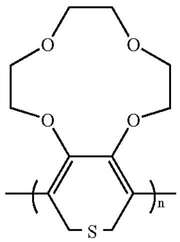

Since the compound (4) has a ring (a ring part) which is the same as that of the compound (3), therefore the compound (4) may capture more Li ions to form a complex.

Therefore, even in case of forming the electron injection/transport layer 22 with LiF like this exemplary embodiment, the metal ion trapping layer 21 is formed as described above. Thus Li ions from the electron injection/transport layer 22 are captured in the metal ion trapping layer 21, thereby reducing or preventing the light-emitting characteristics from being deteriorated. For example, the life thereof form being shortened, which is caused by the diffusion of the Li ions into a light-emitting layer 9. Further, particularly even in a case that Ca ions etc. in the cathode 4 come to diffuse, by capturing the ions and reducing or preventing a diffusion of the ions into the light-emitting layer 9, it is possible to reduce or prevent deteriorating of the light-emitting characteristics.

Furthermore, in case of the compound (3), since crown ether itself has a relatively low molecular weight, even when it captures impurities (Li ions), the crown ether with captured impurities moves into the metal ion trapping layer 21. Consequently, may transfer the captured impurities (Li ions) to the light-emitting layer 9. However, in case of the compound (4), since the compound is a polymer, the molecular weight thereof is high. Therefore, it is difficult for the molecule to move into the metal ion trapping layer 21. Consequently, it is not easy for the captured impurities (metal ions) to be transferred into the light-emitting layer.

Further, in the compound (4), metal ions (Li ions) are captured by a ring part (crown ether). Then, electrons from a thiophene group move to the side of the ring part (crown ether). Therefore it becomes easy for the electrons to be received into the side of the thiophene group. When electrons are received onto the side of a thiophene group, since a thiophene group is polymerized and thus a plurality of thiophene groups are connected to each other in chains, electrons may easily flow along the polymerized direction.

Therefore, the metal ion trapping layer 21 of the present exemplary embodiment functions not only capturing impurities (Li ions) but also showing the electron transporting capability with capturing impurities (Li ions), thereby increasing the light-emitting capability of light emitting layer.

The thickness of the metal ion trapping layer 21 formed of the metal ion trapping material is about 5 nm to 10 nm. Since the metal ion trapping layer 21 of the present exemplary embodiment shows the electron transporting capability as described above, there is no need to control the thickness to be in the range of about 0.1 nm to 5 nm so as not to obstruct the moving of electrons as in the metal ion trapping layer 21 of the second exemplary embodiment. With the construction of forming the thickness of the metal ion trapping layer 21 thicker than that of the second exemplary embodiment, it is possible to place the light emitting layer 9 away from the cathode 11 as much as the thickness difference. Thus exciters in the light-emitting layer 9 lose their activities under the influence of the cathode 4, thereby reducing or preventing the light-emitting capability from being deteriorated.

Also in the present exemplary embodiment, a material to form the metal ion trapping layer 21 is not limited to the compound (4). Other compounds (polymers) may be used if it is a polymer of crown ether. For example, regarding the crown ether part of the compound (4), it is also possible to use the material having 15-crown-5-ether represented by the compound (1), instead of 12-crown-4-ether represented by the compound (3). This construction is particularly advantageous to capture Na ions as impurities (mobile ions) in case of using NaF as the electron injection/transport layer 22.

Further, regarding a part forming a thiophene group, a polymer, for instance, with two thiophene groups corresponding to one crown ether may be used instead of using a polymer having one thiophene group corresponding to one crown ether.

Further, in the present exemplary embodiment, even though a metal ion trapping layer formed of a polymer of a crown ether derivative is provided between the light emitting layer 9 and the electron injection/transport layer 22, the metal ion trapping layer may be provided between the hole injection/transport layer 8 and the light emitting layer 9, as in the first exemplary embodiment shown in FIG. 1.

Fifth Exemplary Embodiment

Next, a fifth exemplary embodiment of an organic El device according to the present invention will be described in the following. The present exemplary embodiment, is similar to the organic EL device 20 shown in FIG. 5 in the basic construction of an organic EL device according to an aspect of the present invention. The difference between the present exemplary embodiment and the second exemplary embodiment shown in FIG. 5 is different in a metal ion trapping material to form the metal ion trapping layer 21.

In the present exemplary embodiment, as a metal ion trapping material to form the metal ion trapping layer 21, a copolymer of a crown ether derivative and a light-emitting material (a polymer-based light-emitting material) to form the light-emitting layer 9 is used. Specifically, poly(crown ether)thiophene-2,5-diyl represented by the compound (4) is used as the crown ether derivative, and materials including (poly)fluorene (PF) derivative, (poly)paraphenylenevinylene (PPV) derivative, polyphenylene (PP) derivative, polyparaphenylene (PPP) derivative, polyvinylcarbazole (PVK) derivative, polythiophene derivative, polysilane, such as polymethylphenylsilane (PMPS) derivative, and the like as a light-emitting material (a polymer-based light-emitting material) to form the light-emitting layer are properly used.

A copolymer of a crown ether derivative and a polyfluorene-based copolymer (a material forming a light-emitting layer) have a ring (a ring part) which is the same as that of the compound (3). Therefore the copolymer captures more Li ions to form a complex.

Therefore, also in case of this exemplary embodiment, by forming the metal ion trapping layer 21 as described above, Li ions from the electron injection/transport layer 22 are captured in the metal ion trapping layer 21, thereby reducing or preventing the light-emitting characteristics from being deteriorated. For example, the life thereof from being shortened, by diffusion of Li ions into the light emitting layer 9. Further, particularly even if Ca ions or the like in the cathode 4 come to diffuse, it captures the ions and reduces or prevents the ions from being diffused into the light-emitting layer 9, thereby reducing or preventing the light-emitting characteristics from being deteriorated.

Furthermore, in the present exemplary embodiment, since the metal ion trapping material is a copolymer, the molecular weight thereof is high. On this account, it is not easy for the molecule to move in the metal ion trapping layer 21. Consequently, it is not easy for the captured impurities (metal ions) to be transferred into the light-emitting layer.

Further, since a material to form light-emitting layer exists in the metal ion trapping layer 21, an affinity between the metal ion trapping layer 21 and the light emitting layer 9 becomes high, and the close adhesion between the two layers is high, thereby enhancing a transferring efficiency of carriers (electrons).

Further, in the present exemplary embodiment, a material to form the metal ion trapping layer 21 is not limited to the above-mentioned copolymer. For example, regarding crown ether derivative, it is possible to use the material having 15-crown-5-ether represented by the compound (1), instead of 12-crown-4-ether represented by the compound (3) as the crown ether part of the crown ether derivative. This construction is also particularly advantageous to capture Na ions as impurities (mobile ions) in case of using NaF as the electron injection/transport layer 22.

Further, in the present exemplary embodiment, even though a metal ion trapping layer formed of a copolymer of a crown ether derivative and a light-emitting material to form a light-emitting layer 9 is provided between the light emitting layer 9 and the electron injection/transport layer 22, the metal ion trapping layer may be also provided between the hole injection/transport layer 8 and the light emitting layer 9, as the first exemplary embodiment shown in FIG. 1.

Further, in the fourth and fifth exemplary embodiments, as in the first and second exemplary embodiments, the metal ion trapping layer 21 may be also placed both, between the hole injection/transport layer 8 and the light-emitting layer 9, and between the light-emitting layer 9 and the electron injection/transport layer 22, respectively.

Furthermore, the copolymer of a crown ether derivative, used as a metal ion trapping material in the fourth exemplary embodiment, may be added directly to the material to form a functional layer, thereby forming a functional layer, particularly a light-emitting layer. With the above construction, in case that it is added to a material to form a light-emitting layer, even though metal ions, from a hole injection/transport layer and an electron injection/transport layer as a carrier injection/transport layer, and the transparent electrode 3 or cathode 4, come to diffuse, a metal ion trapping material captures them to form a complex, thereby receiving them. Therefore, it is possible to reduce or prevent deteriorating of the light-emitting characteristics of the light-emitting layer 9, caused by the metal ions. Further, when the copolymer of a crown ether derivative captures metal ions, it becomes easier for a part other than crown ether, to be polymerized to receive electrons. Therefore, the electron transporting capability is enhanced. Since electrons from the side of the cathode may be easily received into light-emitting layer, the light-emitting efficiency of the light-emitting layer 9 is enhanced.

Further, as a metal ion trapping material, which is used in the fifth exemplary embodiment, the copolymer of a crown ether derivative and a light-emitting material (a polymer-based light-emitting material) to form the light-emitting layer 9, may be used to form a material for the light-emitting layer 9 as a material to form the light-emitting layer 9. In that case, the copolymer may be dissolved in a proper solvent or dispersed in a dispersant to be a liquid material. The liquid material may be placed on the predetermined positions by the liquid droplet discharging method, to form the light-emitting layer 9.

In the organic EL device obtained in this way, even if mobile ions (metal ions) come to diffuse into the light-emitting layer 9, since the ions are captured by crown ether derivative in the light-emitting layer 9, it is possible to reduce or prevent the light-emitting characteristics of the light-emitting layer 9 from being deteriorated. Further, by properly selecting the structure of a crown ether ring in advance, it is possible to give selectivity to metal ions to be captured.

Further, since the liquid material containing a copolymer is placed by the liquid droplet discharging method, it is possible to accurately place the liquid material on predetermined positions. Therefore, for instance, it is possible to accurately place the liquid material corresponding to the color of the light-emitting layer 9 with selectivity.

Moreover, the above-mentioned exemplary embodiments describe that aspects of the present invention may be applied to the organic EL device of a bottom emission type, but the present invention is not limited to the description and can also be applied to a so-called top emission type in which light is emitted from the opposite side of a substrate.

According to an aspect of the present invention, the organic EL device can be properly used as a display part for a variety of electronic apparatus. For example, a word processor, a portable data processing device, such as a personal computer, a mobile phone, a wristwatch type electronic apparatus, and the like. With the above construction, it is possible to attain electronic apparatuses with reliability.

What is claimed is:

1. An organic electroluminescent (EL) device, comprising:

a first electrode;

a second electrode;

a light-emitting layer formed between the first electrode and the second electrode;

a hole injection/transport layer formed between the first electrode and the light-emitting layer; and a metal ion trapping layer formed between the light-emitting layer and the hole injection/transport layer, the metal ion trapping layer being formed of a metal ion trapping material with a ring part including a plurality of Lewis basic elements bonded to at least two carbon atoms, wherein the metal ion trapping material is a polymer of a crown ether derivative.

2. The organic EL device according to claim 1, the metal ion trapping material being a copolymer of a crown ether derivative and a light-emitting layer forming material to form the light-emitting layer.

3. An organic EL device, comprising:

a first electrode;

a second electrode;

a light-emitting layer formed between the first electrode and the second electrode;

a carrier injection/transport layer formed between the first electrode and the light-emitting layer;

a functional layer formed between the light emitting layer and the carrier injection/transport layer;

at least a part of the functional layer being formed of a functional material, to which is added a metal ion trapping material, and the metal ion trapping material having a ring part including a plurality of Lewis basic elements bonded to at least two carbon atoms, wherein the metal ion trapping material is a polymer of a crown ether derivative.

4. An organic EL device, comprising:

a first electrode;

a second electrode;

a light-emitting-layer formed between the first electrode and a second electrode;

a hole injection/transport layer formed between the first electrode and the light-emitting layer; and a metal ion trapping layer formed between the light-emitting layer and the hole injection/transport layer, the metal ion trapping layer being formed of a metal ion trapping material with a ring part including a plurality of Lewis basic elements bonded to at least two carbon atoms, and the light-emitting layer being formed of a copolymer of a crown ether derivative and a polymer-based light-emitting material derivative.

5. A method of manufacturing an organic EL device, comprising:

forming a first electrode;

forming a second electrode;

forming a light-emitting layer between the first electrode and the second electrode;

forming a hole injection/transport layer between the first electrode and the second electrode; and forming a metal ion trapping layer by placing a metal ion trapping material, by a liquid droplet discharging method, between the light-emitting layer and the hole injection/transport layer, the metal ion trapping material having a ring part including a plurality of Lewis basic elements bonded to at least two carbon atoms.

6. A method of manufacturing an organic EL device, comprising:

forming a first electrode;

forming a second electrode;

forming a light-emitting layer between the first electrode and the second electrode;

forming a hole injection/transport layer between the first electrode and the light emitting layer; and forming a metal ion trapping layer by placing a metal ion trapping material between the light-emitting layer and the hole injection/transport layer, the metal ion trapping material with a ring part including a plurality of Lewis basic elements bonded to at least two carbon atoms, the light-emitting layer being formed by placing a liquid material containing a copolymer of a crown ether derivative and a polymer-based light-emitting material derivative, by a liquid droplet discharging method.

7. An electronic apparatus, comprising:

the organic EL device according to claim 1.

* * * * *